United States Patent [19]

Weitzen et al.

[11] 4,313,087

[45] Jan. 26, 1982

[54] APPARATUS FOR DETECTING ELECTRICALLY CONDUCTIVE COATINGS ON DOCUMENTS

[76] Inventors: Edward H. Weitzen, 240 Ocean Ave., Lawrence, N.Y. 11559; Salvatore F. D'Amato, 221 Bellmore St., Floral Park, N.Y. 11001

[21] Appl. No.: 119,511

[22] Filed: Feb. 7, 1980
(Under 37 CFR 1.47)

[51] Int. Cl.³ .......................................... G01R 27/02
[52] U.S. Cl. .................................. 324/65 R; 200/46; 209/534
[58] Field of Search .............. 324/65 R, 65 P; 104/88; 198/352; 200/46; 209/534; 235/925 B, 441

[56] References Cited

U.S. PATENT DOCUMENTS

| | | | |
|---|---|---|---|
| 1,573,174 | 2/1926 | Lasker, Jr. | 324/65 R X |
| 1,997,157 | 4/1935 | Tauschek | 235/441 |
| 2,377,783 | 6/1945 | Hood | 324/65 R X |
| 2,690,300 | 9/1954 | Wilson | 235/441 |
| 3,000,498 | 9/1961 | Cooping | 235/441 X |
| 3,043,993 | 7/1962 | Maltby . | |
| 3,220,549 | 11/1965 | Wong | 209/534 |
| 3,362,532 | 1/1968 | Riddle et al. | 209/534 X |
| 3,678,251 | 7/1972 | Delpino | 235/441 |
| 3,818,335 | 6/1974 | Stungis et al. | 324/65 R |
| 4,044,229 | 8/1977 | Samreus | 200/46 X |
| 4,195,772 | 4/1980 | Nishimura | 235/441 |
| 4,255,652 | 3/1981 | Weber . | |

*Primary Examiner*—Stanley T. Krawczewicz
*Attorney, Agent, or Firm*—Cooper, Dunham, Clark, Griffin & Moran

[57] ABSTRACT

This apparatus tests the genuineness of a document carrying anticounterfeit protection in the form of a usually invisible, electrically conductive coating on at least part of a surface. The apparatus may be arranged to respond to the presence of a coating anywhere on the surface, or it may be arranged to respond only to a coating of specific contour, in a specific location. The apparatus shown comprises an array of contacts and means for supporting a document to be tested in conductive engagement with said contacts. Certain ones of the contacts engage the conductive layer, and are connected in an electric circuit which is completed through the conductive layer. Completion of the circuit is required to produce an indication that the document is genuine. The conductance of the conductive layer must be within a predetermined range in order to produce a signal indicating that the document is genuine. The contacts which engage areas of the document where there should be no conductive layer, may be connected in a second circuit which, if completed through a conductive layer, prevents the production of a signal indicating that the document is genuine.

7 Claims, 8 Drawing Figures

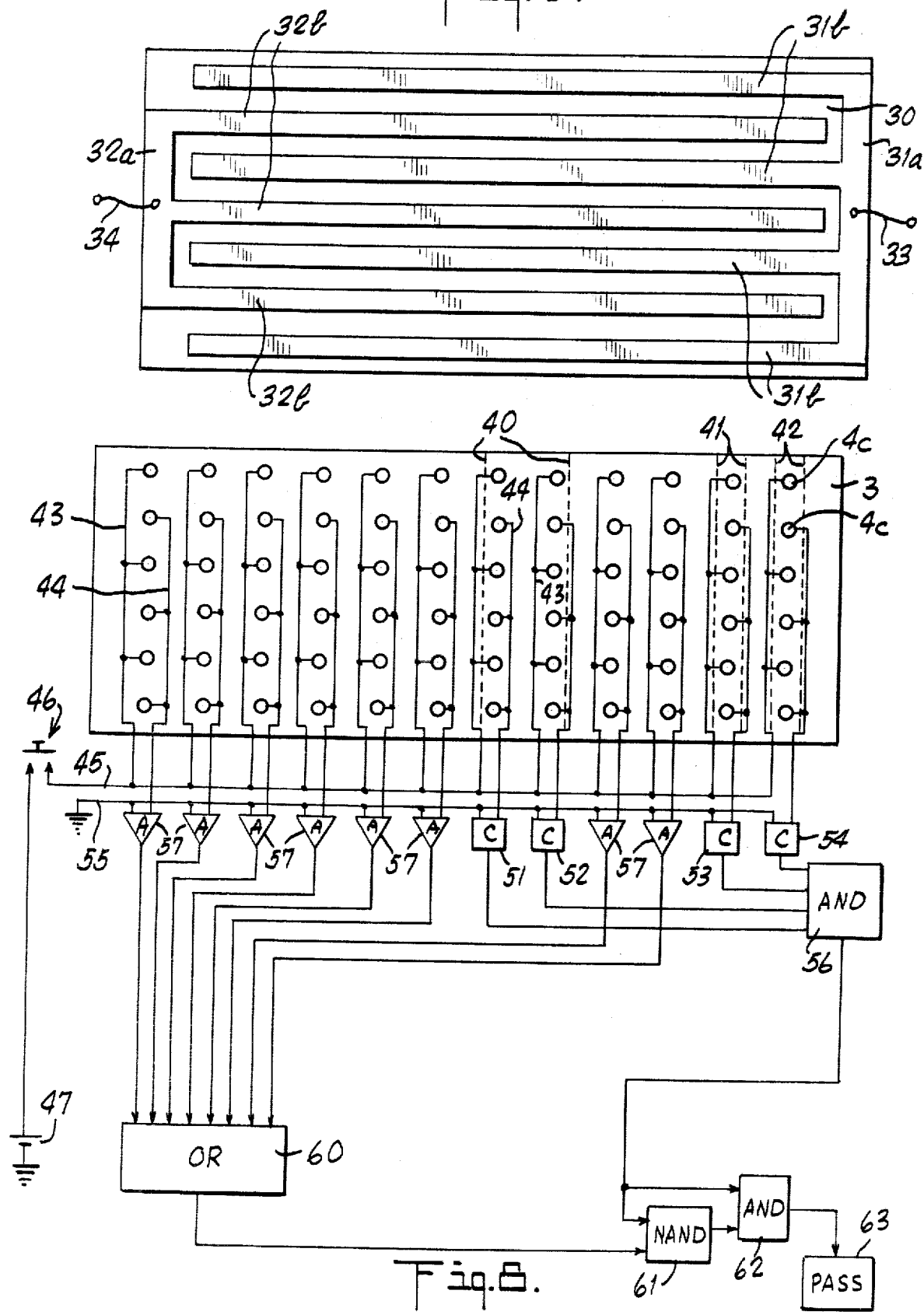

4,313,087

APPARATUS FOR DETECTING ELECTRICALLY CONDUCTIVE COATINGS ON DOCUMENTS

CROSS-REFERENCES RELATED TO THE APPLICATION

This apparatus is intended to be used with a document having a conductive coating produced by the method and apparatus described in the application of Edward H. Weitzen, et al., Ser. No. 085,259, filed Oct. 16, 1979, (Dkt. 17591).

BRIEF SUMMARY OF THE INVENTION

This invention is an apparatus for detecting the presence of a thin, invisible, electrically conductive coating on a surface of a document of value. The apparatus shown is a countertop unit in which a single document to be tested is placed manually. The apparatus includes an array of spaced electrical contact elements fixed on a support member and surrounded by a frame which locates a document under test. A cover forces the document down within the frame and thereby forces the conductive coating against the contacts. In one modification, the engagement of the coating with the contacts is used to complete a circuit which causes a signal to be displayed. In another modification, after the cover is closed, a switch is actuated to energize a certain group of contacts which is in engagement with the electrically conductive layer on the surface of the document. If a conductance within a predetermined range is measured by that group of contacts, then the apparatus tentatively determines the document is genuine, subject to a test of the non-conductivity of other areas of the surface.

Another group of contacts engages the areas of the document where there is no conductive layer and is energized at the same time by the same switch. If that second group of contacts is found to engage an electrically conductive layer, the indication that the document is genuine is prevented.

DRAWINGS

FIG. 7 shows a modified form of contact structure which may be used instead of the supporting plate of FIGS. 1-3.

FIG. 8 is a wiring diagram showing an array of contacts wired to detect a particular coded electrically conductive layer on the surface of a document.

DETAILED DESCRIPTION

FIGS: 1-3

Figure 1:
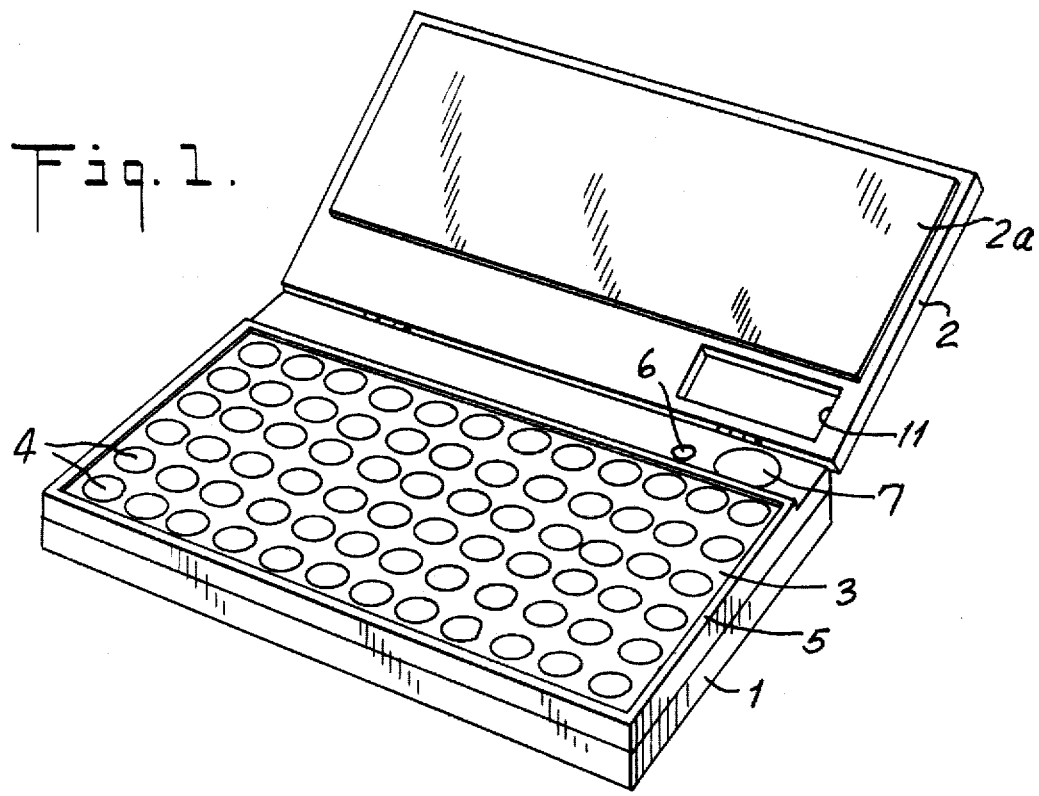
FIG. 1 is a perspective view of an apparatus embodying the invention, with the cover open.
Figure 2:
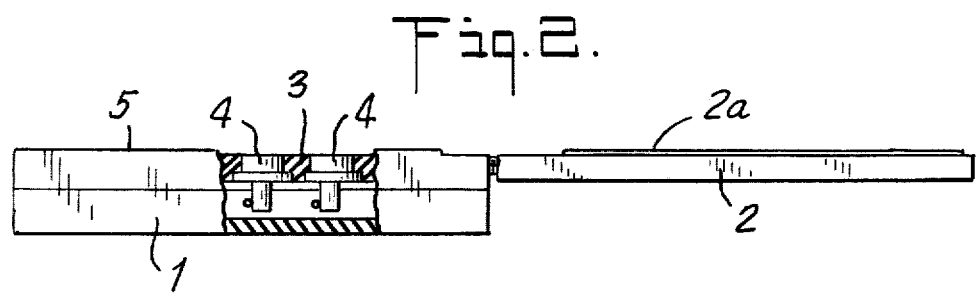
FIG. 2 is a side view, partly broken away, of the apparatus of FIG. 1, also with the cover open.
Figure 3:
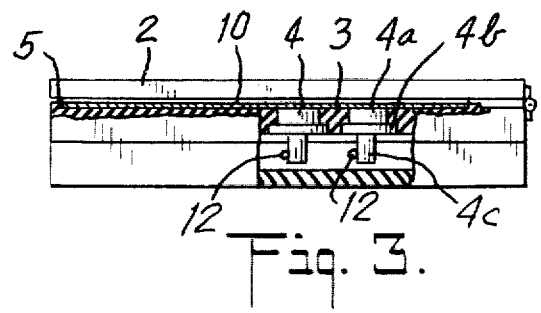
FIG. 3 is a view similar to FIG. 2, but with the cover closed and the document under test in the apparatus.

These figures illustrate an apparatus for detecting a thin, electrically conductive coating on one surface of an electrically non-conductive substrate, e.g., a dollar bill. The substrate is typically paper, although alternatives may be used, such as a coherent, flexible, fibrous sheet of spunbonded olefin, e.g., polyethylene, as described and claimed in the to Steuber, U.S. Pat. No. 3,169,899, which is incorporated by reference herein. The apparatus includes a base 1 having a hinged cover 2. The upper surface of the base is covered by an insulating plate 3 in which is inserted an array of contacts 4. The plate 3 is surrounded by a rim 5 which is adapted to closely receive and locate a document, e.g., a piece of currency, on the plate 3 and contacts 4. At one side of the plate 3 on the base are a pushbutton 6 and an indicator lamp 7. The cover 2 has a shoulder 2a arranged to fit snugly within the rim 5 so as to force the bill 10 firmly into engagement with the contacts 4 when the cover is closed. See FIG. 3. The cover 2 may be provided with one or more openings through which the pushbutton 6 is accessible and the lamp 7 is visible. Such an opening is indicated at 11 in FIG. 1.

Each of the contacts 4 has an upper cylindrical portion 4a having a flat upper surface, a flange 4b and a stem 4c projecting downwardly below the flange 4b. The stems 4c are connected by wires 12 in circuits which may be arranged to detect conductive coatings having a particular arrangement on the surface of the bill.

Instead of the conductive contacts 4, the apparatus may utilize inductive or capacitive devices which, when appropriately energized, e.g., by radio frequency current, could be used to detect the presence of an adjacent conductive layer.

FIGS. 4-6

Figure 4:
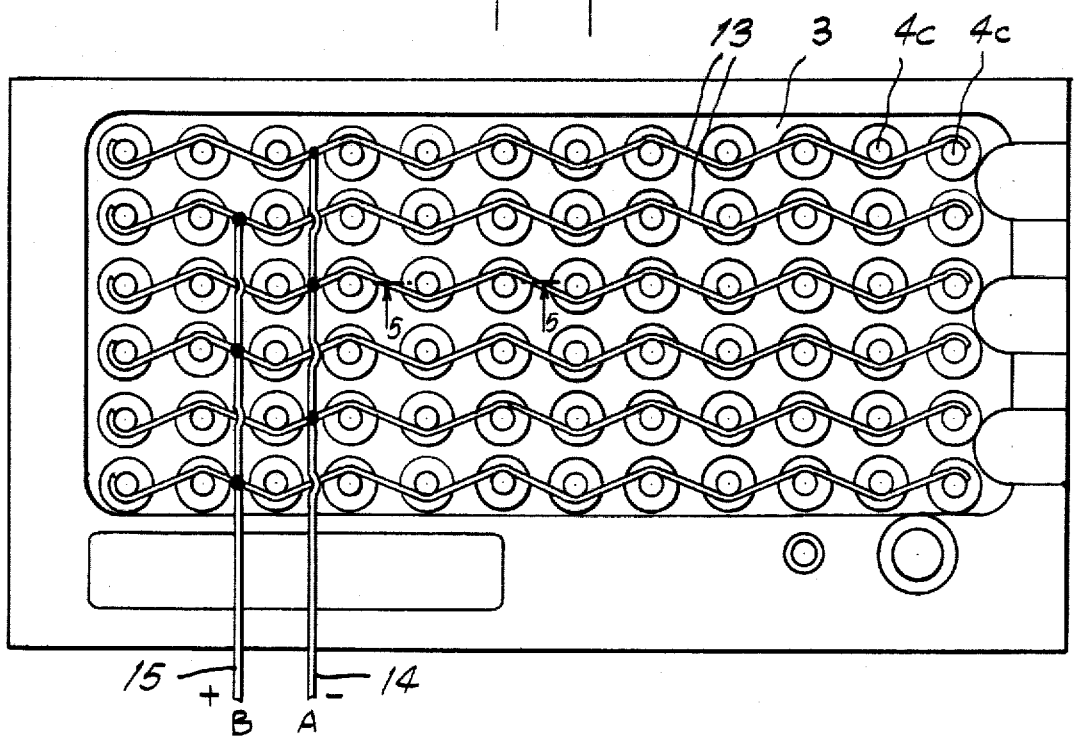
FIG. 4 is a bottom plan view of the supporting member in the apparatus of FIG. 1, showing the electrical connections.
Figure 5:
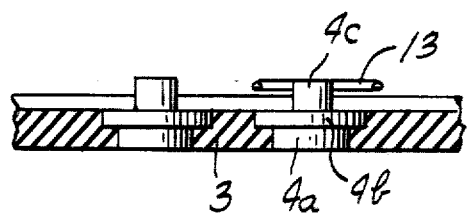
FIG. 5 is a cross-sectional view on the line 5—5 of FIG. 4.

These figures illustrate a circuit arrangement which is suitable for detecting a conductive coating anywhere on the surface of a bill or other document engaging the contacts 4. FIG. 4 is a view of the under side of the plate 3 and shows six rows of projecting contact stems 4c. Each horizontal row of stems 4c is connected by a wire 13. The wires 13 in the first, third and fifth rows, counting from the top of the drawing, are all connected to a wire 14. The wires 13 in the second, fourth and sixth rows are all connected to a wire 15. The wires 14 and 15 are connected to a circuit shown in FIG. 6 which controls the energization of the signal lamp 7.

Figure 6:
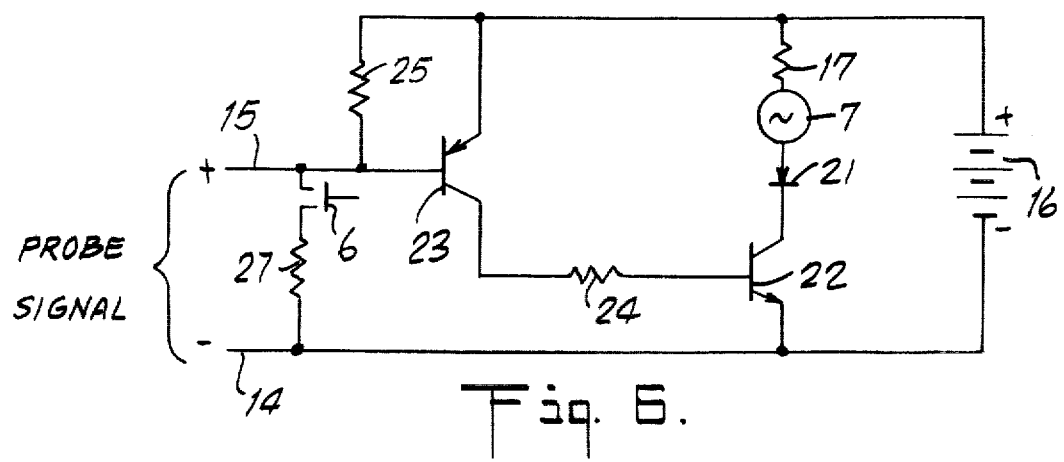
FIG. 6 is an electrical wiring diagram of an indicating system which may be used in the apparatus of FIG. 5.

The circuit of FIG. 6 includes a battery 16. Across the terminals of battery 16 are connected in series a resistor 17, the lamp 7, a diode 21 and the collector and emitter of a transistor 22. Another transistor 23 has its emitter connected to the positive terminal of battery 16. The collector of transistor 23 is connected in series with a resistor 24 to the base of transistor 22. A resistor 25 is connected between the emitter of transistor 23 and the base. Between the base of transistor 23 and the negative terminal of battery 16 is connected a branch circuit including the pushbutton switch 6 and a resistor 27.

When there is no document resting on the contacts 4 and the switch 6 is open, the emitter and base electrodes of transistor 23 are both at the same potential, and that transistor is in its OFF condition. In that state of transistor 23, the base of transistor 22 is maintained at substantially the same potential as its collector, and there is no conduction through transistor 22 so that the lamp 20 is not lighted.

The switch 6 is provided for the purpose of testing the circuit of FIG. 6 to determine whether it is operative. Closure of switch 6 places a voltage divider circuit including resistors 25 and 27 across the terminals of battery 16, so that the base of transistor 23 is connected to a lower potential than the emitter, thereby rendering that transistor conducting. The base of transistor 22 is thereby made more negative than the collector, and that transistor is turned ON, so that current flows through the lamp 20 and illuminates it.

The resistance of resistor 27 is substantially the same as the designed resistance of the conductive coating on a document undergoing test, so that the placing of a document with such a conductive coating in engagement with the contacts 4 has the same effect as closing the switch 26. If the document has the required conductive coating, the lamp 20 is illuminated, indicating that the document is genuine.

FIG. 7

This figure illustrates a modification of the plate 3 of FIGS. 1-5. In this arrangement, the upper surface of an electrically insulating plate 30 is provided with a conductive coating by sputtering or otherwise. Either in the coating process or in a subsequent etching process, the coating is divided into two areas separated by the surface of the insulating plate. One coating area includes a strip 31a extending vertically along the right-hand margin of the plate 30, as viewed in the drawing, and a plurality of horizontally extending strips 31b which are integrally connected with the strip 31a. Similarly, the other coating area includes a strip 32a extending vertically along the left-hand margin of the plate 30 and a plurality of integrally connected strips 32b integrally connected with and extending to the right from the strip 31a. Each strip 32b lies between and is spaced from two strips 31b. If a document having a surface coating of conductive material is placed in contact with the plate 30, that coating completes a circuit between strips 31a and 32a, which are respectively connected to wires 33 and 34, corresponding to the wires 14 and 15 in FIG. 6.

FIG. 8

This figure illustrates a modification of the invention in which the pins 4c in the plate 3 are wired somewhat differently, so as to detect the presence of three conductive bands in specific locations on the surface of the document under test. The locations of the three bands are indicated by pairs of dotted lines 40, 41 and 42. In this figure, each vertical column of pins 4c has the first, third and fifth pins, counting from the upper side of the plate 3 as shown in the drawing, connected to a wire 43. The second, fourth and sixth pins are connected to a wire 44.

All of the wires 43 are connected to a wire 45 which may be connected by closing a pushbutton switch 46 to one terminal of a battery 47, the opposite terminal of which is grounded. The wires 44 associated with the conductive bands 40, 41 and 42 are connected to window comparator circuits 51, 52, 53 and 54. Such comparator circuits produce a signal at their output terminals if the resistance across their input terminals is within a predetermined range of values, and prevent any signal at their output terminals if the resistance at their input terminals is either smaller or larger than that predetermined range of values. A suitable comparator circuit is disclosed in the article entitled "Voltage Level Discriminator Provides Go-No-Go Indication" by Richard Vokoun, appearing in Electronic Design for Nov. 23, 1964, pp. 6769. The other input terminals of the comparator circuits 51, 52, 53 and 54 are connected to ground at 55. The output terminals of the comparator circuits 51, 52, 53 and 54 are connected to the inputs of an AND circuit 56.

Each wire 44 connected to the pins 4c in an area of the plate 3 where no conductive layer is expected to contact the pins is connected to an input terminal of an amplifier circuit 57. The other input terminals of the amplifiers 57 are all connected to ground at 55. Thus, if any conductive layer appears between any of the contacts 4c in these areas, a signal will pass through one of the amplifiers 57. The output terminals of all the amplifiers 57 are connected to inputs of an OR circuit 60. The output terminal of OR circuit 60 is connected to one input of a NAND circuit 61. The output terminal of AND circuit 56 is connected to another input of NAND circuit 61 and also to an input terminal of an AND circuit 62. The output of NAND circuit 61 is connected to the other input terminal of AND circuit 62 and the output of NAND circuit 61 is connected to a signal 63 which, when energized, indicates that the document under test is genuine. Signal 63 may be identical with the lamp 7 of FIG. 1.

If the document under test has the proper conductive coatings in the bands between the pairs of dotted lines 40, 41, and 42, then the comparator circuits 51, 52, 53 and 54 will all supply inputs to the AND circuit 56 which will therefore supply a signal to AND circuit 62 and to the NAND circuit 61. If there is no conductive material in contact with the pins 4c outside the bands 41, and 42, then no signal will be received at any of the inputs to the OR circuit 60, and no signal will be received from the OR circuit 60 at the input of the NAND circuit 61, so that an output signal will be supplied from the output of NAND circuit 61 to the other input of AND circuit 62 and a PASS signal will be displayed by the signal 63. The input terminal of signal 63 may correspond to wire 15 of FIG. 6. The grounded terminals of circuits 56, 60, 61, 62 and 63 are omitted to simplify the drawing.

If the required conductive layer is not present in one of the bands 40, 41 or 42, than no output will be received from the AND circuit 56 and hence there will be no output from the AND circuit 62. If the output is present at the AND circuit 56 but a conductive layer is also detected by one of the amplifiers 57 associated with the areas where there should be no conductive layer, then an output will appear at the OR circuit 60 and the NAND circuit 61 will receive two inputs, one from the AND circuit 56 and the other from the OR circuit 60. It will therefore produce no output signal and the AND circuit 62 will produce no output signal, and the pass indicator 63 will not be energized.

The contact pins 4c of FIG. 8 could be replaced by an array of conductive coatings such as that shown in FIG. 7. Furthermore, the contact pins or conductive coatings could be arranged to detect any particular code of bands or other configurations in which the conductive coatings on the document might be arranged to appear.

We claim:

1. Apparatus for determining the genuineness of a document of electrically non-conductive material coded by means of an invisible, electrically conductive surface layer of predetermined conductance in a limited locality thereof, comprising:
   a. an array of conductance sensing elements separated by insulating means, said array extending over an area greater than the area of said locality;
   b. means for receiving the document in a stationary test position wherein said locality of the document is adjacent a portion only of said array of sensing elements; and c. indicating means, including only said portion of said array of conductance sensing means, said indicating means being operable when the conductance of said layer is within a predetermined range of said predetermined conductance to produce a positive indication that the document is genuine.

2. Apparatus as in claim 1, including:
a. a second portion of said array of conductance sensing elements adjacent at least one other locality of the document in said test position; and
b. means responsive to the conductance sensing elements of said second portion and effective if the conductance in said other locality exceeds a predetermined value to prevent operation of said indicating means to produce said positive indication.

3. Apparatus as in claim 2, in which said limited locality includes at least one band extending across the document surface and said other locality includes all areas of the document surface other than said limited locality.

4. Apparatus for determining the genuineness of a document of electrically nonconductive material coded by means of an invisible electrically conductive surface layer of predetermined conductance in a limited locality thereof, comprising:
a. a support member for receiving the document in a stationary test position with said surface layer facing the support member;
b. an array of spaced electrical contact elements fixed on the support member and adapted to engage said surface layer when the document is in said position;
c. means for engaging the opposite surface of the document and forcing said layer into engagement with the contact elements;
d. means connecting one terminal of an electrical circuit to at least one of the contact elements engaging said limited locality;
e. means connecting a second terminal of said circuit to at least one other of the contact elements engaging said limited locality; and
f. indicating means in said circuit responsive to the conductance between said terminals and operable when said conductance is greater than a predetermined value to produce a positive indication that the document is genuine.

5. Apparatus as in claim 4, including means effective if the conductance is greater than a second predetermined value to prevent operation of said indicating means to produce a positive indication.

6. Apparatus as in claim 4, including means for testing the conductance of said document in a locality other than said limited locality and effective if the conductance in said other locality is greater than a predetermined value to prevent operation of said indicating means to produce a positive indication.

7. Apparatus for determining the genuineness of a document of electrically non-conductive material coded by means of an invisible electrically conductive surface layer of predetermined conductance in a limited area having a location relative to the edges of the document which is defined by the code, comprising:
a. conductance sensing means including an array of electrically conductive elements, each substantially smaller than said area, said elements being separated by insulating means, said array extending over an area substantially greater than the limited area;
b. means for engaging the edges of the document to hold said area in cooperative relationship with only a portion of the elements, said portion being defined by the code;
c. electrical circuit means including only said portion of said elements and responsive to the conductance of said layer; and
d. indicating means operated by said circuit means and effective only when the conductance of said layer is within a predetermined range of said predetermined conductance to produce a positive indication that the document is genuine.

* * * * *